United States Patent
Simmons et al.

(10) Patent No.: US 6,639,231 B1
(45) Date of Patent: Oct. 28, 2003

(54) METHOD OF OBTAINING A PERFORMANCE PARAMETER FOR AN ION IMPLANTER AND AN ION IMPLANTER EMPLOYING THE METHOD

(75) Inventors: Jonathon Yancey Simmons, San Jose, CA (US); David Eugene Aberle, Milpitas, CA (US); Biagio Gallo, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/278,999

(22) Filed: Oct. 24, 2002

(51) Int. Cl.[7] ............................... H01J 37/08
(52) U.S. Cl. ............... 250/492.21; 250/492.1; 250/492.2; 250/492.3; 250/423 R; 315/111.81
(58) Field of Search ............... 250/492.1, 492.2, 250/423 R, 429.21, 492.3; 315/111.81

(56) References Cited

U.S. PATENT DOCUMENTS

| | | | | |
|---|---|---|---|---|
| 4,587,433 A | * | 5/1986 | Farley | 250/492.2 |
| 5,760,409 A | * | 6/1998 | Chen et al. | 250/492.21 |
| 6,323,497 B1 | * | 11/2001 | Walther | 250/492.21 |

* cited by examiner

Primary Examiner—John R. Lee
Assistant Examiner—James P. Hughes
(74) Attorney, Agent, or Firm—Boult Wade Tennant; Joseph Bach

(57) ABSTRACT

A performance parameter for an ion implanter is obtained by monitoring vacuum pressure in a vacuum chamber of the implanter to identify pulses of said pressure caused by outgassing from the wafer surfaces during respective scans or groups of scans of the wafer through the ion beam. The pressure values are integrated during the identified pulses to provide a series of pulse pressure integral values which provide the performance parameter. An increase in the integral values indicates deterioration in vacuum system performance.

14 Claims, 2 Drawing Sheets

METHOD OF OBTAINING A PERFORMANCE PARAMETER FOR AN ION IMPLANTER AND AN ION IMPLANTER EMPLOYING THE METHOD

FIELD OF THE INVENTION

The invention is concerned with ion implanters and in particular a method of obtaining a performance parameter for an ion implanter and ion implanters arranged for performing this method.

BACKGROUND OF THE INVENTION

Ion implanters have a vacuum enclosure in which a beam of ions for implantation is generated. The beam is directed at a wafer to be implanted which is mounted on a holder in a process chamber of the vacuum enclosure. A scanning arrangement effects repeated relative scanning of the ion beam over the wafer to complete an implant cycle. In batch implanters, a number of wafers (a batch) is processed simultaneously in a single implant cycle. Typically, the batch of wafers is mounted around the periphery of a wheel like structure in the process chamber and the wheel is rotated so that the wafers are sequentially scanned across the ion beam. At the same time, the axis of rotation of the wheel is reciprocated to and fro so that ions are implanted evenly over the exposed surfaces of the wafers.

Single wafer serial implanters are also known in which individual wafers are treated with a complete implant cycle one after the other. A typical batch type implanter is described in U.S. Pat. No. 5,389,793, and a single wafer serial implanter is described in U.S. Pat. No. 5,898,179.

The arrangement for relative scanning of the ion beam and the wafer mounted on the wafer holder may be fully mechanical, as in the batch type implanter disclosed in the above referred U.S. Pat. No. 5,389,793, or may be a hybrid of mechanical scanning in one direction and scanning of the ion beam in the other direction, as described in U.S. Pat. No. 5,898,179. Furthermore, two dimensional beam scanning systems are also known in which the wafer is held substantially stationary whilst the beam itself is scanned in two orthogonal directions to complete the implant cycle. The present invention is relevant to implanters with any beam scanning arrangement, whether mechanical, hybrid or beam scanning (whether electrostatic or electromagnetic), as applied to both batch and single wafer serial type implanters.

For successful operation of the ion implanter, the vacuum enclosure is pumped down to a low pressure typically of the order of $10^{-5}$ Torr. The maintenance of an appropriate vacuum pressure within the vacuum enclosure is important for the integrity of the implant process. An important mechanism for the control of a positively charged ion beam is so called self neutralisation of the beam. In the absence of any neutralisation, the beam is essentially positively charged so that the ions of the beam tend to electrostatically repel each other, causing the beam to defocus, and in extreme cases to collapse. Self neutralisation arises because energetic beam ions cause electrons to become dissociated from low energy residual gas atoms within the vacuum enclosure, and these low energy electrons then have the effect of at least partially neutralising the beam potential so that the tendency of the beam to blow up through the effects of space charge is reduced.

If the vacuum pressure within the enclosure through which the ion beam is passing is too low, insufficient low energy electrons are produced from residual gas atoms, so that the beam is inadequately neutralised.

On the other hand, if the residual pressure within the vacuum enclosure is too high, collisions with beam ions may produce energetic residual gas atoms and ions which can result in undesirable contamination of the process wafer. Accordingly, it is important to ensure that the vacuum pressure is maintained at an appropriate level during implanting, that is to say it is important to monitor the performance of the vacuum system of the implanter. Appropriate vacuum levels are maintained within the implanter vacuum enclosure by means of a combination of turbo pumps and cryo pumps of kinds well known to workers experienced in vacuum systems.

A complicating factor in ion implantation is the tendency of the ion implantation process itself to produce bursts of outgassing from the wafers being implanted, with consequential rises in residual gas pressure, at least within the process chamber containing the wafers being implanted. This outgassing is caused by the sputtering or "burning off" of layers of photoresist applied to wafers prior to implanting in order to define those regions of the wafer surface which are to receive a dose of implanted ions during the implant cycle. This outgassing phenomenon is well know to those experienced in the field of ion implanters for manufacturing semiconductor devices.

Clearly, the vacuum system of the implanter must be capable of maintaining an appropriate mean vacuum pressure within the enclosure of the ion implanter, and in particular the process chamber, in spite of the bursts of outgassing during the implant process.

Nevertheless, outgassing typically produces sudden rises in residual gas pressure, particularly in the process chamber followed by a fall in residual pressure when outgassing ceases and the vacuum pumps bring the residual pressure back down again. The resulting peaks in residual pressure make it difficult to monitor the overall performance of a vacuum system and, hitherto, the first indication of poor performance of a vacuum system, that is poor dynamic pumping, is when wafers which have been processed by the implanter begin to fall below the necessary quality criteria.

SUMMARY OF THE INVENTION

An object of the invention is to provide a method of obtaining a performance parameter for an ion implanter, particularly one which can be used to monitor performance of a vacuum system.

Accordingly, the invention provides a method of obtaining a performance parameter for an ion implanter of the kind which operates by effecting repeated relative scanning of an ion beam over at least one wafer to be implanted to complete an implant cycle, comprising:

a) monitoring vacuum pressure in a vacuum chamber of the implanter to identify pulses of said pressure caused by outgassing from the wafer surface during respective scans or groups of scans of said repeated scanning, and b) integrating pressure values during said identified pulses to provide pulse pressure integral values for respective said pulses, said integral values providing said performance parameter.

It has been found that by identifying and integrating pressure pulses detected in a vacuum chamber of the implanter, a useful parameter is provided for monitoring the performance of the implant process and of the implanter itself.

The pulse integral values may be monitored to determine whether the values exhibit a selected trend indicating a reduction in performance of the vacuum system of the implanter. This trend may be exhibited when the pulse integral values exceed a running mean of said values by more than a predetermined amount. Alternatively, the trend may be exhibited when the pulse integral values are increasing relative to a base line. The base line used may not be constant throughout an implant cycle, but may be varied during said scanning to compensate for variations in the amount of outgassing per scan or group of scans of the ion beam over a wafer during an implant cycle. In particular, the rate of outgassing from the wafer typically declines during an implant cycle as the material in the photoresist which is expelled during implanting becomes exhausted in the photoresist layer. The resulting decline in the pulse integral values during an implant cycle could mask a reduction in the performance of the vacuum system for example.

Preferably, said pulses of said pressure are identified by comparing the monitored vacuum pressure with a threshold pressure value, and the pressure values are integrated for the duration of the pulse when said monitored pressure exceeds said threshold value.

The invention also provides an ion implanter comprising a vacuum enclosure, an ion beam generator for generating in the vacuum enclosure a beam of ions for implantation, a holder for holding at least one wafer to be implanted, a scanner to effect repeated relative scanning of the ion beam over said at least one wafer to complete an implant cycle, whereby each respective scan or each of a group of said scans of said beam over said at least one wafer can cause a corresponding burst of outgassing from the wafer surface, a vacuum pressure detector providing electrical signals indicative of vacuum pressure in the vacuum enclosure, a vacuum pressure monitor responsive to said electrical signals to identify pulses of said pressure caused by said bursts of outgassing, an integrator to integrate each of said pressure pulses to provide respective pulse pressure integral values, and an implant performance monitoring system receiving said pulse pressure integral values as a performance parameter.

BRIEF DESCRIPTION OF THE DRAWINGS

Examples of the present invention will now be described with reference to the accompanying drawings in which.

DETAILED DESCRIPTION OF THE PREFERRED EMBODIMENTS

Figure 1:
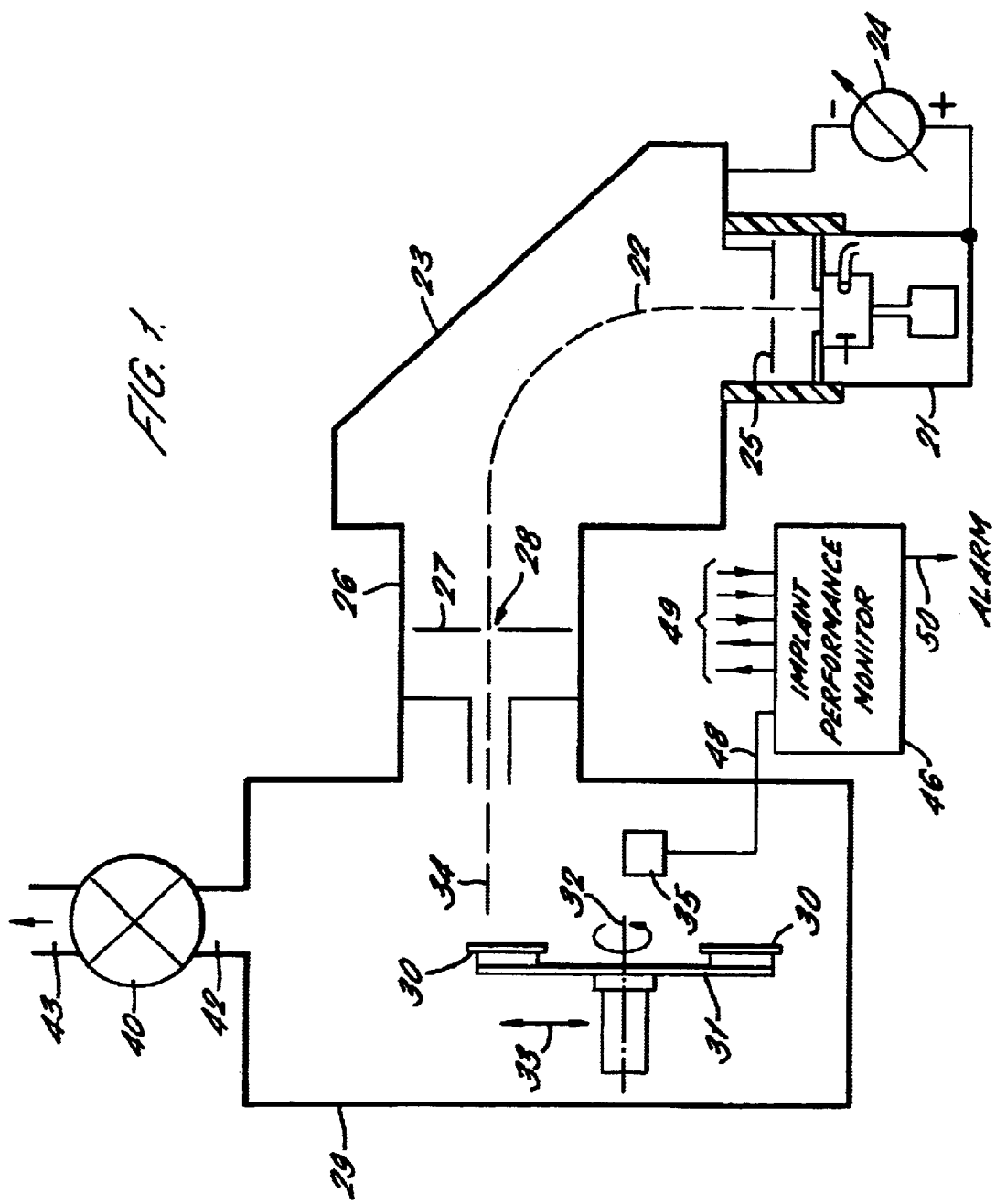
FIG. 1 is a schematic representation of an ion implanter embodying the present invention.

Referring to FIG. 1, an ion implanter has a vacuum enclosure comprising an ion source chamber 21, a mass analyser enclosure 23 and a process chamber 29. The ion source chamber 21 is held at a predetermined positive electrical potential relative to the mass analyser 23 and process chamber 29, by means of an adjustable electrical supply 24. The ion source within ion source chamber 21 may be of a type well known to workers in this field, for example a Bernas source or a Freeman source. Ions formed within an arc chamber of the source are extracted by extraction electrodes, represented schematically by electrode 25 in the drawing, to form a beam 22 of extracted ions. The energy of the ions of the beam 22 is determined by the voltage bias provided by the electrical supply 24. The mass analyser 23 provides a region of uniform magnetic field which is normal to the paper in FIG. 1 so that ions of the beam 22 travel in curved paths through the analyser 23, with the radius of curvature dependent on the momentum of individual ions. Since ions in the beam 22 of particular charge state enter the analyser 23 with nominally the same energy, the radius of the curved path through the analyser 23 is dependent on the mass of the ions. The analyser 23 is arranged to bring ions of the same mass to a focus at the plane of a mass resolution slit 27 located in a connecting piece 26 between the analyser 23 and the process chamber 29. The mass resolution slit 27 has an aperture 28 through which ions of a selected mass pass so that the beam continuing from the mass resolution slit 27 contains substantially only ions of a desired species for implantation.

Within the process chamber 29, wafers 30 to be implanted are mounted around the periphery of a scanning wheel 31 which is mounted for rotation about an axis 32. The rotation axis 32 of the scan wheel 31 is itself mounted for translational movement to and fro within the process chamber 29, in the direction of the arrow 33. As a result of the combined scanning action provided by rotation of the scan wheel 31 and translation of the axis of rotation of the wheel, all parts of wafers 30 mounted on the wheel are scanned through the ion beam 34 entering the process chamber 29.

Details of the scan wheel 31, together with the arrangements for holding wafers 30 at wafer support positions above the periphery of the scan wheel 31, and the mechanism for translating the axis of the scan wheel to and fro in the process chamber 29, may be determined from the above referred U.S. Pat. No. 5,389,793.

With a scanning arrangement of this kind, each wafer 30 scans past the beam 34, once per revolution of the scan wheel 31, so that the beam 34 effectively draws a respective stripe across the wafer 30. At the same time, as the axis of rotation 32 of the scan wheel 31 is translated in the direction of arrow 33, the location of the "stripe" drawn by the beam 34 on each rotation of the scan wheel 31, moves across the respective wafer 30 radially inwardly and then outwardly, so that all parts of the wafer receive a uniform dose of implanted ions over the full implant cycle.

Each "stripe" of the beam across a wafer 30, produced by a revolution of the scan wheel 31, can be regarded as a fast scan of the beam across the wafer 30. Each full reciprocation of the axis 32 of the scan wheel 31 can be regarded as a slow scan across the beam in a direction generally orthogonal to the fast scan direction.

As is known by those experienced in this field, the entire vacuum enclosure of the implanter is maintained at a relatively low vacuum, to permit the ion beam to be transported through the enclosure without substantial loss through collisions with residual gas atoms. On the other hand, as explained above, an excessively low residual gas vacuum pressure within the enclosure is also undesirable in some applications, where residual gas atoms can provide free electrons within the enclosure to assist in neutralising space charge in the ion beam. Generally, evacuation ports may be provided at two or more locations at different positions along the beam path of the vacuum enclosure. In FIG. 1, however, a single vacuum pump 40 is illustrated connected via a vacuum port 42 to the process chamber 29. The vacuum pump 40 may be of any known kind sufficient to maintain a required level of vacuum within at least the process chamber 29 of the vacuum enclosure of the ion implanter. Typically, vacuum pump 40 includes a cryo-pump.

Within vacuum chamber 29, a pressure sensor 35 is responsive to residual gas pressure to provide a vacuum pressure signal on line 48 which is supplied to an implant performance monitor 46. The implant performance monitor may also receive signals from additional sensors associated with the implanter, and may provide output control signals or parameter monitoring signals on additional lines 49 as indicated. Residual gas pressure sensor 35 within the process chamber 29 may be of the kind normally used for monitoring pressure within the various chambers of an ion implanter. Ion gauge type residual pressure detectors are well known for this purpose. Importantly, the pressure sensor 35 should be capable of providing residual gas pressure readings at a relatively high rate, sufficient to allow variations in residual gas pressure to be monitored. Thus the rate at which pressure readings should be available must be at least twice the maximum rate of change of pressure which it is intended to detect within the process chamber 29.

A well known phenomenon in ion implantation is outgassing. When regions of a wafer surface which are coated with photoresist are exposed to the ion beam, elements of the photoresist are effectively sputtered and/or burned away, producing a burst of outgassing which can cause a rise in the residual gas pressure within the process chamber. In operation, the vacuum pump 40 must be capable of absorbing this outgassing from the wafer being implanted, so that the time averaged gas pressure within the process chamber 29 remains within desired operational levels.

In the scanning wheel system illustrated in FIG. 1, the wheel 31 is typically rotated at speeds of the order of 1250 rpm (approximately 20 Hz). The wafers 30 are mounted on the scan wheel 31 with relatively small gaps between adjacent wafers. As a result, outgassing from wafers 30 on the scan wheel 31 is substantially continuous over a revolution of the scan wheel, when the axis 32 of rotation is in a slow scan position (arrows 33) in which the wafers 30 intersect the ion beam 34. Even when the slow scan position is such that only the outer or inner edges of wafers 30 are passing through the beam 34, the time between adjacent wafers 30 intersecting the ion beam 34 is small compared to the pump down time constant of the vacuum pump 40 (i.e. a measure of the time taken for vacuum pump 40 to pump down the residual gas pressure from a higher level resulting from an outgassing burst).

Figure 2:
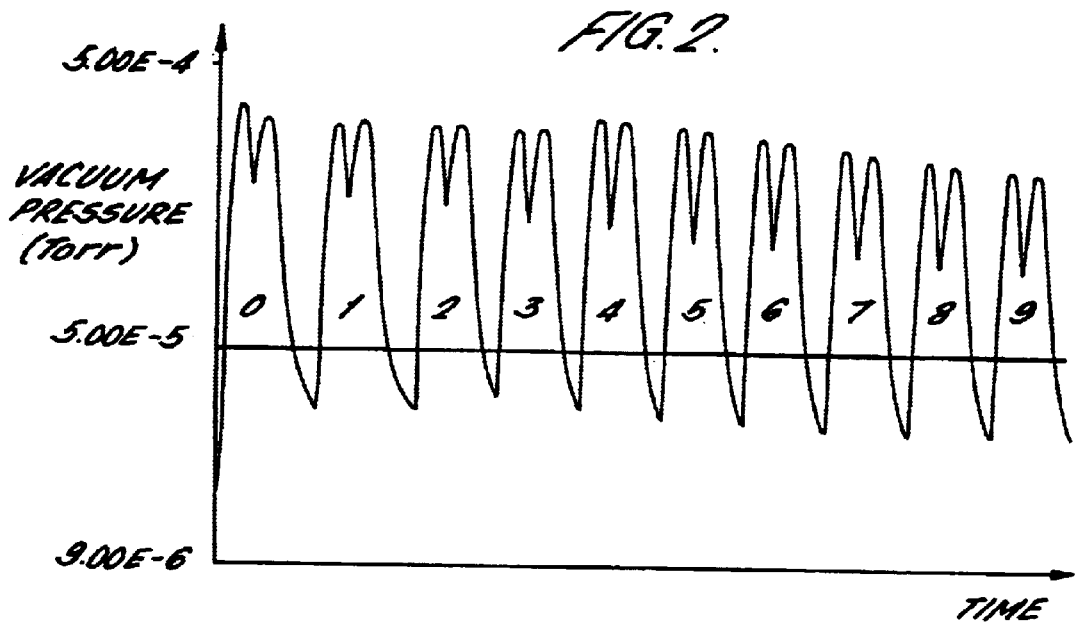
FIG. 2 is a graphical representation of pulses in the residual pressure in a process chamber of the ion implanter, caused by outgassing from wafers being implanted.

FIG. 2 illustrates a sequence of residual gas pressure pulses resulting from successive slow scans of the scan wheel 31, i.e. full reciprocations of the axis 32 in the direction of arrow 33. A full reciprocation or slow scan of the scan wheel 31 may be considered to start with the scan wheel axis 32 at the lowest position in FIG. 1 so that the beam 34 passes the radially outer periphery of the wheel and of wafers mounted on the wheel, to proceed upwards until the beam 34 just clears the radially inner edge of wafers 30 on the wheel and then to return back to the start position. During such a "slow scan" of the scan wheel, the residual pressure measured by the sensor 35 in the process chamber 29 exhibits a pulse shape of the form shown repeatedly in the graphical representation of FIG. 2.

Thus, the measured residual pressure in the chamber 29 exhibits a series of pulses with each pulse corresponding to a respective slow scan from scan 0 to scan 9. As can be seen, each pressure pulse starts with a rise in pressure as the slow scan begins so that the scan wheel periphery and the wafers 30 thereon progressively intersect the ion beam 34. As the slow scan reaches the halfway point where the ion beam briefly misses the radially inner edges of the wafers 30, the pressure drops, before rising again as the slow scan direction reverses, before falling off at the end of the slow scan as the vacuum pump 40 pumps the chamber down again.

The implant performance monitor 46 receives the pressure signals from the sensor 35 over line 48 at a rate which may be between 100 and 250 samples per second, for example. The monitor 46 converts the voltage values representing pressure on line 48 into true pressure values and provides a smoothing filter, e.g. using a running average of, for example, four successive samples.

This filtered pressure value is then continuously compared against a predetermined trip point pressure, represented in FIG. 2 by the horizontal line at the pressure 5.00E-5 Torr.

Each time the pressure value exceeds this trip point level, the performance monitor 46 is arranged to integrate the pressure values during the ensuing pulse, until the pressure value again drops below the trip level. In this way, the monitor produces a series of integrated pressure values corresponding to the area under each of the pulses corresponding to scans 0 to 9 illustrated in FIG. 2.

Figure 3:
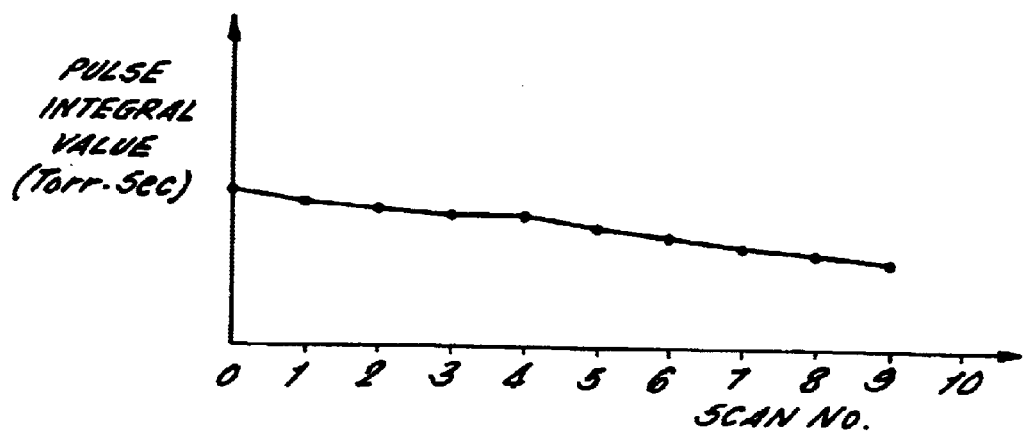
FIG. 3 is a graphical representation of the values of the integrals of the pressure pulses represented in FIG. 2, plotted against the scan number of the scanning system of the implanter during which the pressure pulse is produced.

FIG. 3 illustrates a plot of these integrated pressure values for successive slow scans of the implanter against scan number. As can be seen, in the example shown, the integrated pressure values progressively decline during the implant cycle from scans 0 to 9.

These integrated pressure values, corresponding to integrating successive pressure peaks caused by outgassing during successive scans of the implanter, provide a useful performance parameter for the implanter. By monitoring these pressure peak integration values during an implant cycle, the performance of the vacuum system can be determined. If, as illustrated in FIG. 3, the pressure peak integration values decline during an implant cycle, then good vacuum pump performance is indicated. An increase in pressure pulse integral value during the cycle would indicate deterioration in vacuum performance. Such deterioration would otherwise be difficult to detect because of the highly variable nature of residual gas pressure within the process chamber, due to periodic outgassing from wafers during implant.

Different algorithms may be used for monitoring the pulse integral values for different purposes. Generally, when the pulse integral values are used for monitoring vacuum system performance, the values are monitored to determine whether the values exhibit a trend indicating a reduction in the vacuum performance. For example the performance monitor may check when the pulse integral values exceed a running mean of said values by more than a predetermined amount. In another example, the monitor may check for the trend exhibited when the pulse integral values are increasing relative to a base line. In such an arrangement, the base line itself may be varied during a scan cycle of the implanter to compensate for variations in the amount of outgassing per scan or group of scans of the ion beam over a wafer during an implant cycle. It should be understood that the degree of outgassing from wafers being processed can decline during an implant cycle as the more volatile species within the photoresist layer are expelled. In order for the monitoring system to be most sensitive for detecting a decrease in performance of the vacuum system, the base line used for comparison with the pulse integral values should be similarly reduced during scanning so as to compensate for the expected reduction in outgassing over the implant cycle.

Apart from monitoring the performance of the vacuum system, the pressure pulse integral values obtained as described above, can also be useful for providing an indication of a possible problem with the wafers being processed, particularly with the resist layer on these wafers.

For this purpose, the values of the integrals of individual pressure pulses may be compared against a datum value and the monitor 46 can be arranged to provide an alarm if the pressure pulse integral value is excessive. This can indicate defective resist on the wafers being implanted, for example.

Generally, however, the way in which successive pulse integral values vary during an implant cycle is used to provide information on the performance of the implanter, particularly the vacuum performance.

Although the above example of the invention has been described with reference to a batch type implanter having multiple wafers mounted around the periphery of a scan wheel, so that individual wafers are mechanically scanned in two orthogonal directions, examples of the invention may also be used in implanters operating with different scanning systems including hybrid beam scanning/mechanical scanning systems and also single wafer serial implanters. In order to enable a performance parameter to be obtained as described above in relation to the batch implanter, the scanning system should operate with a succession of scans during which corresponding pressure pulses can be produced as a result of outgassing from the wafer being implanted. For example, a single wafer serial implanter is known of the type in which the ion beam is scanned in one direction and the wafer is then moved through the plane of the scanned beam. The beam may be scanned at a rate of 100 Hz or more and the wafer may be moved through the scanned beam at a relatively slower repetition rate of 1 Hz or less. An example of single wafer serial implant scanning is described in U.S. Pat. No. 5,898,179. In such a scanning arrangement, a residual pressure pulse can be produced during each slow mechanical scan of the wafer through the plane of the scanned beam.

In the above described example of the invention particularly with reference to FIG. 2, the pressure pulses are integrated above a threshold value of 5.00E-5 Torr. In practice, an appropriate threshold value is selected specifically for the individual process to be performed by the implanter. Different processes, and recipes, can produce different amounts of outgassing, so that a different threshold level should be selected to ensure the resulting pressure pulse integration values can be used as desired as a good performance parameter of the implanter, particularly for monitoring vacuum system performance. The appropriate threshold values for use for a particular process can be determined empirically.

In the examples described above, the pressure is monitored in the process chamber of the implanter, where maximum pressure excursions can be expected due to proximity with the outgassing wafers during an implant cycle. However, the pressure may be monitored at other locations within the implanter vacuum enclosure. Individual pressure excursions in, for example, the source chamber region, may be monitored in this way and used to indicate a serious failure of the vacuum system of the implanter.

However, when using the invention as described in the example above for monitoring pressure in the process chamber, it has been possible to detect indications of poor dynamic pumping before the results of the implant process are effected. Hitherto, the first signs of a vacuum system performance problem have often been exhibited in a reduction in the quality of implants. As a result of the advanced warning provided by monitoring the process chamber pressure as indicated above, it has been possible to detect problems with cryo-pumps, requiring replacement or regeneration, before these can cause damage to wafers being processed.

Generally speaking, the implant performance monitor can be set up to apply selected checking algorithms to the pressure signal on line 48, in accordance with the various examples of the invention discussed above, and to provide appropriate alarm indications, e.g. on line 50.

Other examples and embodiments of the invention will be apparent to those skilled in the art, falling within the scope of the following claims.

What is claimed is:

1. A method of obtaining performance parameter for an ion implanter of the kind which operates by effecting repeated relative scanning of an ion beam over at least one wafer to be implanted to complete an implant cycle, comprising:

a) monitoring vacuum pressure in a vacuum chamber of the implanter to identify pulses of said pressure caused by outgassing from the wafer surface during respective scans or groups of scans of said repeated scanning, and b) integrating pressure values during said identified pulses to provide pulse pressure integral values for respective said pulses, said integral values providing said performance parameter.

2. A method as claimed in claim 1, wherein said pulse integral values are monitored to determine whether said values exhibit a selected trend indicating a reduction in performance of the vacuum system of the implanter.

3. A method as claimed in claim 2, wherein said selected trend is exhibited when said pulse integral values exceed a running mean of said values by more than a predetermined amount.

4. A method as claimed in claim 1, wherein said pulse integral values are individually monitored to determine if any of said values exceeds a threshold.

5. A method as claimed in claim 2, wherein said selected trend is exhibited when said pulse integral values are increasing relative to a base line.

6. A method as claimed in claim 5, wherein said base line is varied during said scanning to compensate for variations in the amount of outgassing per scan or group of scans of the ion beam over a wafer during an implant cycle.

7. A method as claimed in claim 1, wherein said pulses of said pressure are identified by comparing the monitored vacuum pressure with a threshold pressure value, and the pressure values are integrated for the duration of the pulse when said monitored pressure exceeds said threshold value.

8. An ion implanter comprising:

a vacuum enclosure, an ion beam generator for generating in the vacuum enclosure a beam of ions for implantation, a holder for holding at least one wafer to be implanted, a scanner to effect repeated relative scanning of the ion beam over said at least one wafer to complete an implant cycle, whereby each respective scan or each of a group of said scans of said beam over said at least one wafer can cause a corresponding burst of outgassing from the wafer surface, a vacuum pressure detector providing electrical signals indicative of vacuum pressure in the vacuum enclosure, a vacuum pressure monitor responsive to said electrical signals to identify pulses of said pressure caused by said bursts of outgassing, an integrator to integrate each of said pressure pulses to provide respective pulse pressure integral values, and an implant performance monitoring system receiving said pulse pressure integral values as a performance parameter.

9. An ion implanter as claimed in claim 8, wherein said monitoring system is arranged to monitor said pulse integral values and to generate an alarm signal in response to determining that said values exhibit a selected trend indicating a reduction in performance of the vacuum system of the implanter.

10. An ion implanter as claimed in claim 9, wherein said monitoring system is arranged to calculate a running mean of said pulse integral values and to generate said alarm on determining that said values exceed said running mean by more than a predetermined amount.

11. An ion implanter as claimed in claim 8, wherein said monitoring system is arranged to generate an alarm signal if an individual pulse integral value exceeds a threshold.

12. An ion implanter as claimed in claim 9, wherein said monitoring system is arranged to generate an alarm if said pulse integral values are increasing relative to a base line.

13. An ion implanter as claimed in claim 12, wherein said monitoring system is arranged to vary said base line during operation of said scanner over an implant cycle so as to compensate for variations during the implant cycle in the amount of outgassing per scan of the ion beam over the wafer.

14. An ion implanter as claimed in claim 8, wherein said pressure monitor is operative to compare the monitored vacuum pressure with a threshold pressure value to identify said pulses, and the integrator is operative to integrate pressure values when the monitored pressure exceeds said threshold value.

* * * * *